United States Patent

Narabe et al.

[11] Patent Number: 5,978,094
[45] Date of Patent: Nov. 2, 1999

[54] ALIGNMENT DEVICE AND METHOD BASED ON IMAGING CHARACTERISTICS OF THE IMAGE PICKUP SYSTEM

[75] Inventors: Tsuyoshi Narabe, Ohmiya; Kei Nara, Yokohama; Masamitsu Yanagihara, Zama, all of Japan

[73] Assignee: Nikon Corporation, Tokyo, Japan

[21] Appl. No.: 08/940,289

[22] Filed: Sep. 30, 1997

Related U.S. Application Data

[63] Continuation of application No. 08/570,548, Dec. 11, 1995, abandoned.

[30] Foreign Application Priority Data

Dec. 14, 1994 [JP] Japan .................................... 6-332972

[51] Int. Cl.⁶ ................................................ G01B 11/00
[52] U.S. Cl. ........................ 356/401; 356/363; 250/548
[58] Field of Search ..................... 356/363, 399, 356/400, 401; 250/548

[56] References Cited

U.S. PATENT DOCUMENTS 4,780,616  10/1988  Nishi et al. .......................... 356/401

*Primary Examiner*—Robert H. Kim
*Attorney, Agent, or Firm*—Vorys, Sater, Seymour and Pease LLP

[57] ABSTRACT

An alignment device includes an image pickup optical system for picking up an image of a first reference mark disposed on a mask and an image of a second reference mark disposed on a photosensitive substrate through an image pickup optical system, a memory for storing information associated with the imaging characteristics of the image pickup optical system, and a correction system for correcting the positions of the first and second reference marks, detected using image information from the image pickup system, on the basis of the information associated with the imaging characteristics of the image pickup optical system.

30 Claims, 5 Drawing Sheets

ALIGNMENT DEVICE AND METHOD BASED ON IMAGING CHARACTERISTICS OF THE IMAGE PICKUP SYSTEM

This is a continuation of application Ser. No. 08/570,548 filed Dec. 11, 1995, now abandoned.

BACKGROUND OF THE INVENTION

1. Field of the invention

The present invention relates to an alignment device and method and, more particularly, to a device and method, which can be suitably applied to alignment between a photosensitive substrate and a mask in the manufacture of a liquid crystal display device using a projection exposure apparatus.

2. Related Background Art

A conventional alignment device of this type attains alignment by image processing. More specifically, as shown in FIG. 8, the alignment device picks up images of alignment marks 1 and 2 disposed on the mask surface and the photosensitive substrate surface using an image detector such as a CCD camera independently or simultaneously. Subsequently, the alignment device detects the positions of the alignment marks 1 and 2 in the picked-up image, and calculates the relative distance between the alignment marks 1 and 2. Alternatively, when the positional relationship (e.g., the distance) between a predetermined point in the screen and each alignment mark is measured, the alignment device measures the position of the predetermined point in advance, then measures the position of the alignment mark with respect to that point, and compares the measured position of the alignment mark with the design position of the alignment mark.

This method can detect the degree of a deviation of the photosensitive substrate from the screen having reference lines in a lattice pattern (FIG. 8). The alignment device attains alignment between a mask and a photosensitive substrate on the basis of the relative distance or the distance from the predetermined point.

SUMMARY OF THE INVENTION

In the above-mentioned alignment device, the image detector normally picks up images of the alignment marks (reference marks) 1 and 2 via an image pickup optical system in an alignment microscope. The alignment device calculates the relative distance between the alignment marks 1 and 2 or the distance from the predetermined point directly using the positions of the alignment marks 1 and 2 detected from the picked-up images.

However, since the image pickup optical system suffers imaging characteristics such as distortion, an image picked up by the image detector via the image pickup optical system also suffers distortion, as shown in FIG. 9. For this reason, the positions of the alignment marks 1 and 2 detected based on this image have position errors unlike in a case wherein the positions are detected based on an ideal image free from any distortion shown in FIG. 8.

The position errors lower the position detection accuracy of the alignment marks 1 and 2 in the screen. Therefore, if the relative distance between the marks is calculated while such position errors remain unremoved, an accurate relative distance cannot be obtained, and the mask and the photosensitive substrate cannot be accurately aligned.

In this connection, the orthogonal broken lines in FIG. 8 represent an equal-interval distance scale matrix free from any distortion, and the broken lines swelled outwardly in FIG. 9 represent a state wherein the distance scale matrix is deformed by the distortion.

The present invention has been made in consideration of the above situation, and has as its object to provide an alignment device and method, which can detect the positions of first and second reference marks (alignment marks 1 and 2) respectively disposed on a mask and a photosensitive substrate with high accuracy on the basis of image information which is influenced by the imaging characteristics of an image pickup optical system, so as to be distorted, and can accurately align the mask and the photosensitive substrate.

In order to achieve the above object, an alignment device of the present invention comprises an image pickup system (13) for picking up an image of a first reference mark (1) disposed on a mask (4) and an image of a second reference mark (2) disposed on a photosensitive substrate (5) through an image pickup optical system (11), a memory (15) for storing information associated with the imaging characteristics of the image pickup optical system (11), and a correction system (14) for correcting the positions of the first and second reference marks, detected using image information (S3) from the image pickup system (13), on the basis of the information associated with the imaging characteristics of the image pickup optical system (11) stored in the memory (15).

In the alignment device of the present invention, since the correction system (14) corrects the actually measured positions of the first and second reference marks (1 and 2) obtained from the image information (S3) from the image pickup system (13) on the basis of the information associated with the imaging characteristics of the image pickup optical system (11) stored in the memory (15), alignment between the mask (4) and the photosensitive substrate (5) can be performed with higher accuracy on the basis of the image information (S3) which is influenced (or distorted) by the imaging characteristics of the image pickup optical system (11).

DESCRIPTION OF THE PREFERRED EMBODIMENTS

An embodiment of the present invention will be described below with reference to the accompanying drawings.

Figure 1:
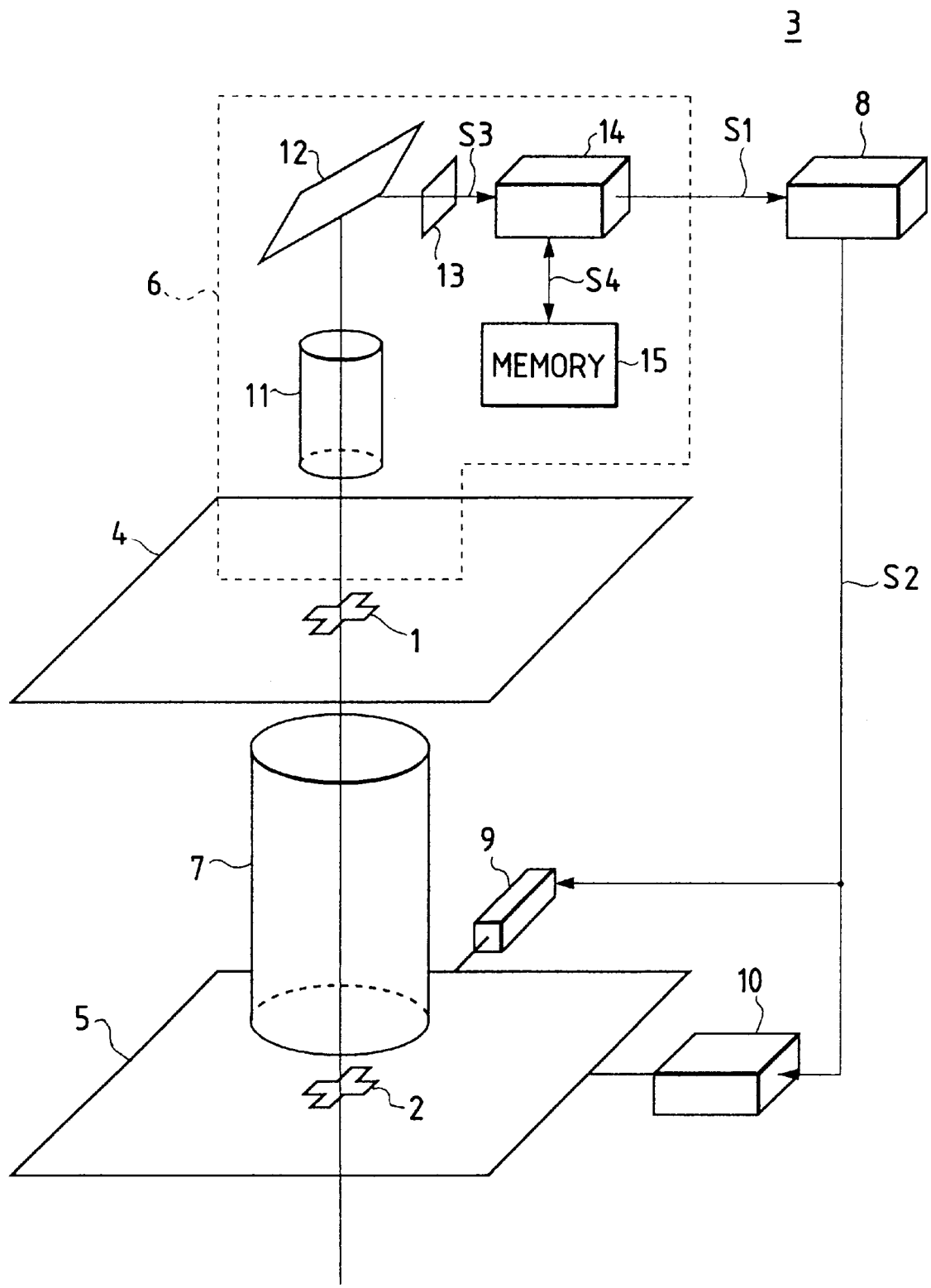
FIG. 1 is a schematic view showing the arrangement of a projection exposure apparatus to which an alignment device according to an embodiment of the present invention is applied.

FIG. 1 shows the arrangement of a projection exposure apparatus to which the present invention is applied. In FIG. 1, the arrangement of principal part of a projection exposure apparatus for manufacturing a large-size liquid crystal display plate is indicated by reference numeral 3 as a whole. The projection exposure apparatus attains alignment between a mask 4 and a photosensitive substrate 5 using a position detection system of an image processing method.

More specifically, a position detection system 6 fetches image information of an alignment mark 1 and its surrounding portion on the mask 4 into an image processing unit 14. Also, the position detection system 6 fetches image information of an alignment mark 2 and its surrounding portion on the photosensitive substrate 5 into the image processing unit 14 via a projection optical system 7 and the mask 4.

The image processing unit 14 performs image processing of the images of the alignment marks 1 and 2 and their surrounding portions, and outputs a position signal S1 indicating the positions of the alignment marks 1 and 2 to a controller 8. The controller 8 outputs a control signal S2 based on the received position signal S1 to driving units 9 and 10 for stages (not shown) on which the photosensitive substrate 5 is placed, and driving units (not shown) for stages (not shown) on which the mask 4 is placed. The driving units 9 and 10 move the photosensitive substrate 5 in accordance with the control signal S2, thereby attaining alignment between the mask 4 and the photosensitive substrate 5.

The position detection system 6 has an alignment microscope, and light beams from the alignment mark 1 on the mask 4, the alignment mark 2 on the photosensitive substrate 5, and their surrounding portions are caused to be incident on an image pickup optical system 11 in the alignment microscope. A light beam emerging from the image pickup optical system 11 is reflected by a reflection plate 12, and forms an image on an image detector 13 such as a CCD. Thus, the image detector 13 outputs, to the image processing unit 14, an image signal S3 which is obtained by simultaneously picking up the images of the alignment marks 1 and 2 in a single image.

Figure 2:
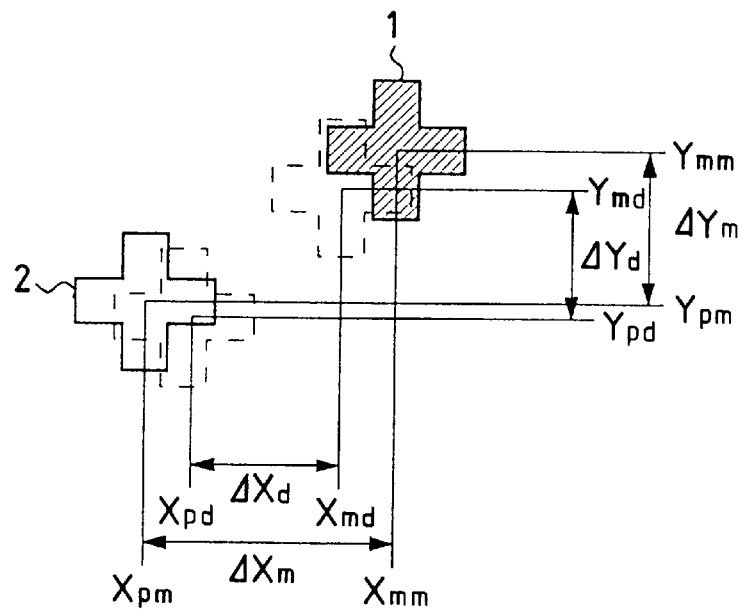
FIG. 2 is a schematic view showing the positions of alignment marks obtained when an image obtained via an image pickup optical system is measured, and the design positions thereof.

The image processing unit 14 processes the image signal S3 to detect the positions of the alignment marks 1 and 2. More specifically, the image processing unit 14 obtains $(x_{mm}, y_{mm})$ and $(x_{pm}, y_{pm})$ as the x- and y-coordinates of the alignment marks 1 and 2 on an X-Y orthogonal coordinate system, as shown in FIG. 2. Also, the image processing unit 14 obtains intervals $\Delta x_m$ and $\Delta y_m$, in the x- and y-directions, of the alignment marks 1 and 2, using the following equations:

$$\Delta x_m = x_{mm} - x_{pm} \quad (1)$$

$$\Delta y_m = y_{mm} - y_{pm} \quad (2)$$

In this case, if the design x- and y-coordinates of the alignment marks 1 and 2 are $(x_{md}, y_{md})$ and $(x_{pd}, y_{pd})$, the image processing unit 14 obtains design intervals $\Delta x_d$ and $\Delta y_d$, in the x- and y-directions, of the alignment marks 1 and 2, using the following equations:

$$\Delta x_d = x_{md} - x_{pd} \quad (3)$$

$$\Delta y_d = y_{md} - y_{pd} \quad (4)$$

From equations (1) to (4), the image processing unit 14 obtains deviation amounts $\Delta X$ and $\Delta Y$, in the x- and y-directions, of the mask 4 and the photosensitive substrate 5 using the following equations:

$$\Delta X = \Delta x_m - \Delta x_d \quad (5)$$

$$\Delta Y = \Delta Y_m - \Delta y_d \quad (6)$$

A memory 15 stores distortion data S4 of the image pickup optical system 11. Upon calculation of the deviation amounts $\Delta X$ and $\Delta Y$, the image processing unit 14 corrects the detection positions of the alignment marks on the basis of the distortion data S4, and outputs the position signal S1.

Distortion of an image to be processed by the image processing unit 14 is generated by the projection optical system 7 and the image pickup optical system 11. Since exposure light passes through the projection optical system 7 in an exposure mode, any position detection error caused by the distortion of the projection optical system 7 has almost no influence on exposure. On the other hand, the image pickup optical system 11 is not used in the exposure mode, and is used in only an alignment mode. For this reason, any position detection error caused by the distortion of the image pickup optical system 11 directly appears as a position error in the exposure mode. For example, if the distortion caused by the image pickup optical system 11 is 0.1%, and the design interval between the alignment marks is 100 μm, an alignment error of 0.1 μm is generated.

Figure 3:
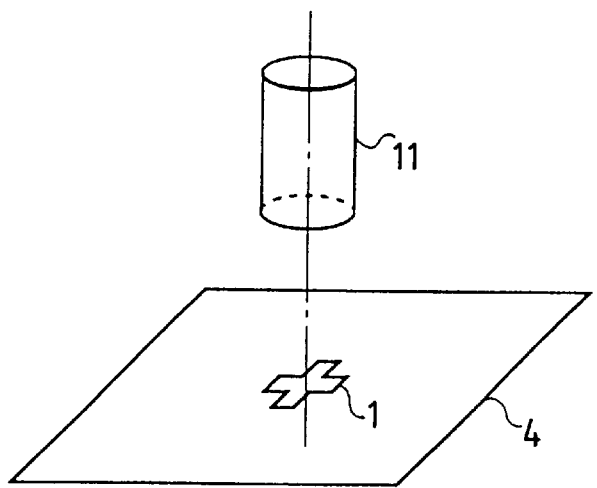
FIG. 3 is a perspective view showing the position when the alignment mark is arranged at the center of the screen.
Figure 4:
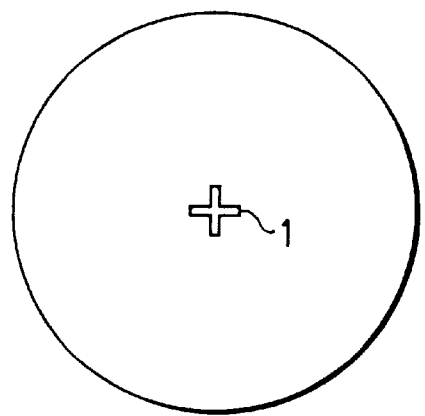
FIG. 4 is a schematic view showing a state wherein the alignment mark is disposed at the center of the view field of the image pickup optical system.

In the above-mentioned arrangement, before alignment between the mask 4 and the photosensitive substrate 5, the image processing unit 14 forms a data map used for correcting the distortion of the image pickup optical system 11 (to be referred to as a correction map hereinafter). More specifically, as shown in FIG. 3, the image processing unit 14 measures the alignment mark 1 on the mask 4 at the center of the screen. As shown in FIG. 4, the position of the alignment mark 1 at this time is located on the optical axis of the image pickup optical system 11.

Figure 5:
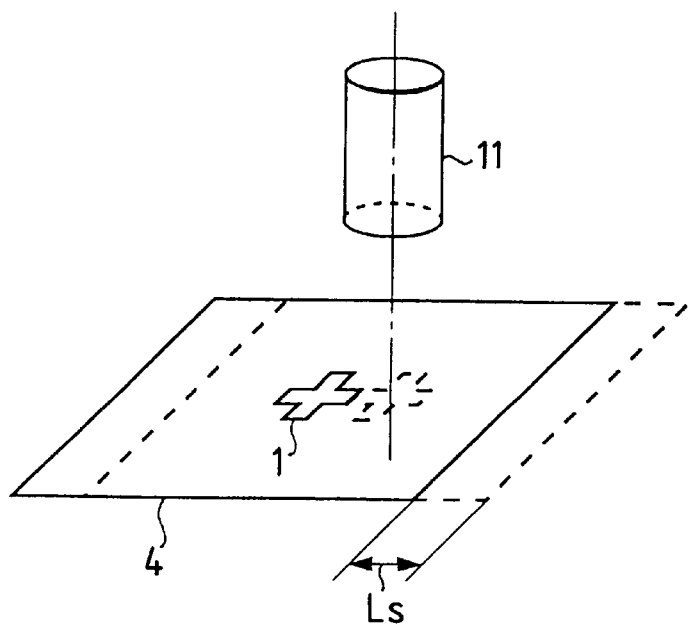
FIG. 5 is a perspective view showing the position of the alignment mark after mask movement.
Figure 6:
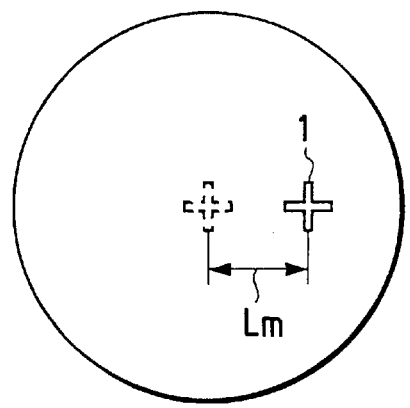
FIG. 6 is a schematic view showing the position of the alignment mark in the view field of the image pickup optical system after mask movement.

Thereafter, as shown in FIG. 5, the alignment device 3 moves the mask 4 by a predetermined design value $L_s$ in one axial direction within the view field of the image pickup optical system 11. (It is assumed that movement of the mask 4 includes no error.) Subsequently, as shown in FIG. 6, the image processing unit 14 measures the position of the alignment mark 1 based on the image to obtain an interval $L_m$ before and after the movement of the alignment mark 1.

The image processing unit 14 stores, in the memory 15, the difference between the moving distance $L_s$ of the mask 4 and the interval $L_m$ before and after the movement of the alignment mark 1 as the distortion data S4 at that position caused by the image pickup optical system 11.

In this manner, the image processing apparatus 14 forms a correction map corresponding to a large number of positions in the range of the view field of the image pickup optical system 11 by repetitively moving the mask 4 by a small distance within the view field of the image pickup optical system 11, and measuring the alignment mark 1.

Subsequently, upon alignment between the mask 4 and the photosensitive substrate 5, the image processing unit 14 corrects the actually measured positions of the marks using the distortion data S4 of the correction map, and measures the coordinates $(x_{mm}, y_{mm})$ and $(x_{pm}, y_{pm})$ of the alignment marks 1 and 2. With this processing, since the image processing unit 14 performs calculations using the intervals $\Delta x_m$ and $\Delta y_m$, which has been subjected to distortion correction, the deviation amounts ΔX and ΔY in the x- and y-directions can be obtained with higher accuracy.

According to the above arrangement, since the actually measured positions of the alignment marks 1 and 2 obtained from the image signal S3 are corrected using a plurality of distortion data S4 stored in the memory 15, and the coordinates of the alignment marks 1 and 2 are respectively measured, the positions of the alignment marks 1 and 2 respectively disposed on the mask 4 and the photosensitive substrate 5 can be obtained with higher precision on the basis of the image signal S3 which is influenced by the imaging characteristics of the image pickup optical system 11, i.e., is distorted.

The above-mentioned embodiment exemplifies alignment between the mask 4 to be exposed by the projection exposure apparatus and the photosensitive substrate 5 used for manufacturing a liquid crystal display plate. However, the present invention is not limited to this. For example, the present invention can be applied to exposure operations using arbitrary exposure apparatuses such as a proximity exposure apparatus, a scanning exposure apparatus, and the like, and also to exposure operations on arbitrary substrates such as a semiconductor substrate in addition to the photosensitive substrate 5 used for manufacturing a liquid crystal display plate. In this case, the same effect as described above can be obtained.

Figure 7:
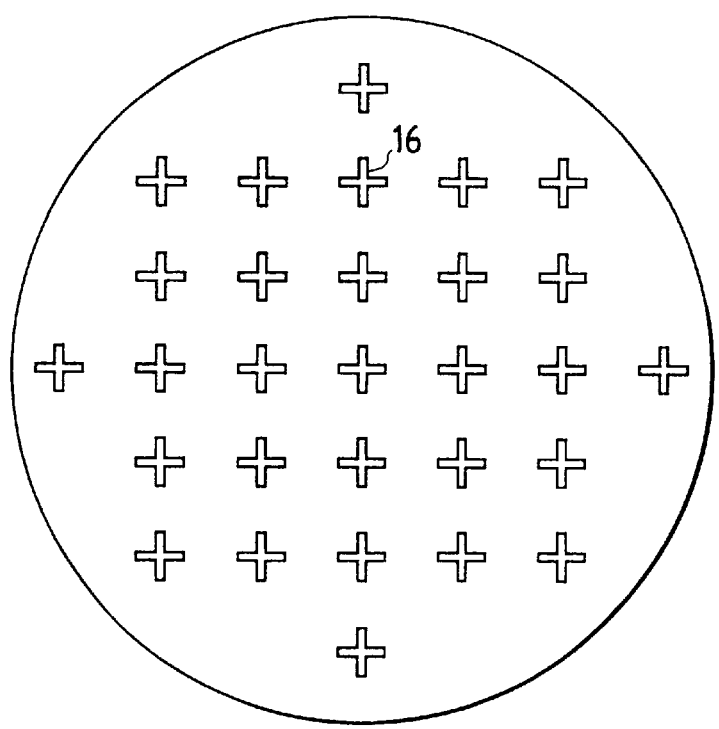
FIG. 7 is a view showing the layout of a plurality of alignment marks in the view field of the image pickup optical system according to another embodiment of the present invention.
Figure 8:
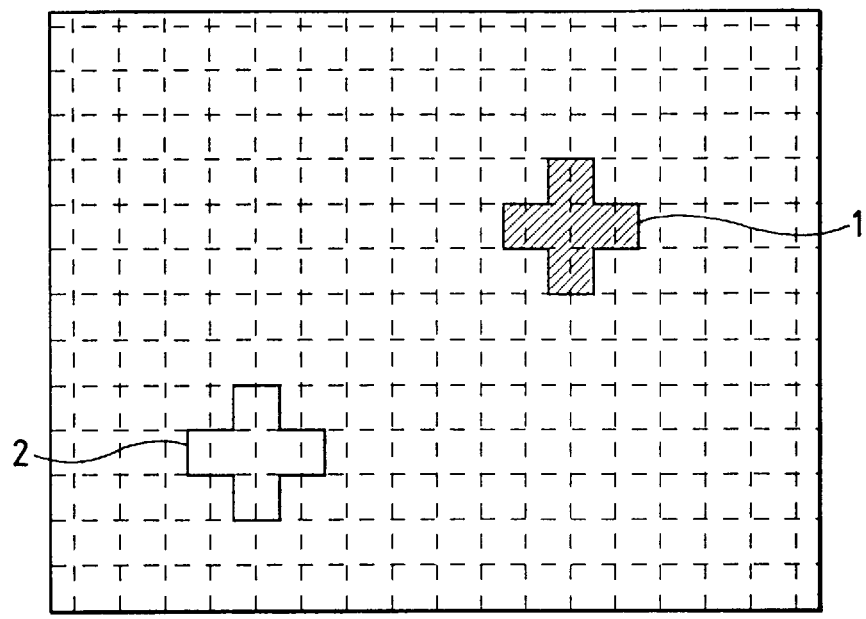
FIG. 8 is a schematic view showing an image free from any distortion.
Figure 9:
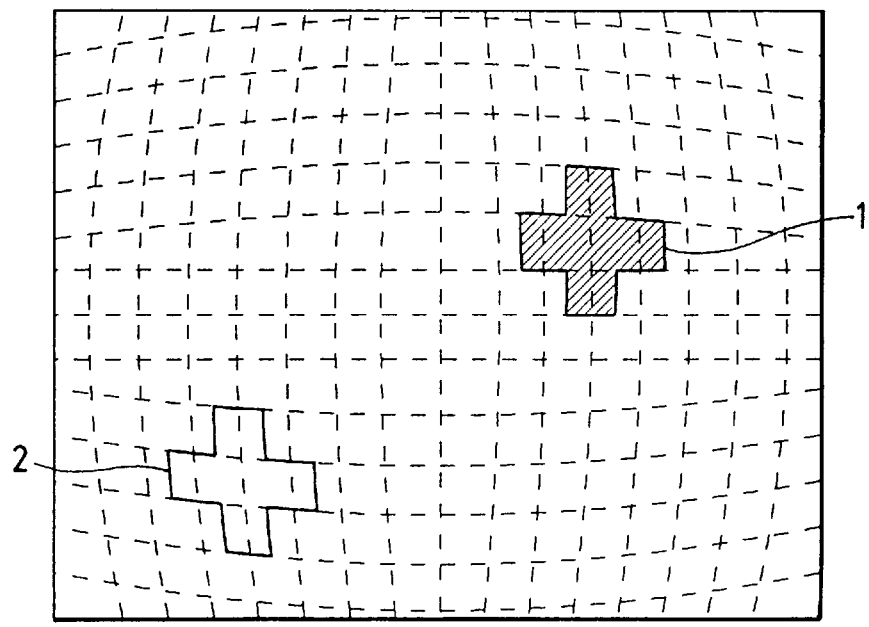
FIG. 9 is a schematic view showing an image suffering from distortion.

In the above-mentioned embodiment, only one alignment mark 1 is disposed on the mask 4, and a plurality of distortion data S4 are obtained by repetitively moving the mask 4. However, the present invention is not limited to this. For example, as shown in FIG. 7, a plurality of alignment marks 16 may be disposed at predetermined intervals on the mask surface or the photosensitive substrate surface to fall within the single view field of the image pickup optical system 11, and thereafter, the positions of the alignment marks 16 may be measured without moving the image pickup optical system 11 or the mask to obtain a correction map of distortion data to be used in alignment with higher accuracy. In this case, as shown in FIG. 7, a plurality of alignment marks are simultaneously exposed (or transferred) onto the photosensitive substrate using a single mask on which these plurality of alignment marks are disposed and their positions are accurately measured in advance. Thereafter, only the positions of the alignment marks on the photosensitive substrate are measured using a microscope (image pickup optical system 11). Errors are calculated from the measurement values of the alignment marks on the photosensitive substrate, and the measurement values (or design values of alignment marks) obtained when the positions of the alignment marks on the mask are measured.

Furthermore, in the above-mentioned embodiment, when the distortion data S4 are obtained, a correction map is formed by performing measurements at a large number of positions in the view field. However, the present invention is not limited to this. For example, the positions of some representative points in the view field may be measured, and a correction map may be formed by approximation.

In the above-mentioned embodiment, the image processing unit 14 corrects the actually measured positions of the alignment marks 1 and 2 with reference to the distortion data stored in the memory 15. However, the present invention is not limited to this. For example, the image processing unit 14 may input the actually measured positions of the alignment marks 1 and 2 to the controller 8, and the controller 8 may correct the positions using the distortion data stored in the memory 15.

Moreover, in the above-mentioned embodiment, an error is detected by simultaneously fetching the image of the alignment mark 1 on the mask 4 and the image of the alignment mark 2 on the photosensitive substrate. However, the present invention is not limited to this. The present invention may be applied to a case wherein an error is detected by fetching only the image of the alignment mark 2 on the photosensitive substrate 5.

What is claimed is:

1. An alignment device for use in an exposure apparatus for exposing a pattern on a mask onto a photosensitive substrate through a projection optical system, comprising:
    an image pickup system which picks up an image of a first reference mark disposed on the mask through an image pickup optical system which is different from said projection optical system;
    a memory which is connected to said image pickup system, and which stores information associated with imaging characteristics of the image pickup optical system; and
    a correction system which is connected to said image pickup system, and which corrects a position of said first reference mark, using image information from said image pickup system, based on said information associated with the imaging characteristics stored in said memory.

2. An alignment device according to claim 1, wherein said image pickup system picks up an image of a second reference mark disposed on said photosensitive substrate through said image pickup optical system, and said correction system corrects a position of said second reference mark based on the information associated with the imaging characteristics.

3. An alignment device according to claim 1, wherein said exposure apparatus in an exposure apparatus used for manufacturing a liquid crystal display element.

4. An alignment method comprising the steps of:
    picking up an image of a mark disposed on a substrate through an image pickup optical system; and
    detecting a position of said mark based on the image of said mark picked up by said image pickup optical system and imaging characteristics of said image pickup optical system.

5. An alignment method according to claim 4, wherein:
    said image picking-up step comprises the step of picking up another reference mark disposed on another substrate through said image pickup optical system; and
    further comprising:
    correcting a position of said reference marks based on information associated with imaging characteristics of the image pickup optical system.

6. An alignment method according to claim 5, further comprising the step of aligning said substrates based on the positions of said reference marks after correction.

7. A method according to claim 6, further comprising the step of:
    exposing the photosensitive substrate to an image of a pattern on the mask.

8. An alignment method according to claim 7, wherein a liquid crystal display element is formed by the exposure.

9. An alignment method of claim 4, wherein said substrate is a mask which is formed with a pattern.

10. An alignment method comprising the steps of:
    picking up an image of a mark at a location on an optical axis of an image pickup optical system and an image of a mark spaced from said location by a predetermined distance; and performing an alignment after detecting imaging characteristics of said image pickup optical system based on results of said image picking-up step and said predetermined distance.

11. An alignment method according to claim 10, wherein said image picking-up step comprises, after picking up the image of said mark at said location, the step of shifting a stage which holds a substrate formed with said mark at said location by said predetermined distance.

12. An alignment method according to claim 10, wherein said imaging characteristics comprise distortion of said image pickup optical system, and data regarding the distortion is stored in a memory.

13. An alignment method according to claim 10, wherein said mark at said location in formed on a mask having a pattern, and the method further comprises the step of exposing an image of the pattern on the mask onto a photosensitive substrate.

14. An alignment method according to claim 13, wherein said image of the pattern is projected by a projection optical system.

15. An alignment method according to claim 10, wherein said image of the mark at said location and said image of the mark spaced from said location by a predetermined distance are formed by the same mark before and after a shift of a substrate formed with the mark, respectively.

16. A position detection device for use in an exposure apparatus for exposing a pattern on a mask onto a substrate through a projection optical system, comprising:

an image pickup optical system having a predetermined positional relationship with respect to an optical axis of said projection optical system, which picks up an image of a mark which is formed on at least one of said mask and said substrate; and a detector which detects a position of said mark based on the image of said mark picked up by said image pickup optical system and imaging characteristics of said image pickup optical system.

17. A position detection device according to claim 16, wherein said detector has a memory which stores data concerning imaging characteristics of said image pickup optical system.

18. A position detection device according to claim 16, wherein said position detection device is of an image processing type, and said detector has an image processing device optically connected to said image pickup optical system.

19. A position detection device for use in an exposure apparatus for exposing a pattern on a mask onto a substrate, comprising:

an image pickup optical system disposed above said mask, which picks up an image of a mark which is formed on at least one of said mask and said substrate; and a detector which detects a position of said mark based on the image of said mark picked up by said image pickup optical system and imaging characteristics of said image pickup optical system.

20. A position detection device according to claim 19, wherein said detector has a memory which stores data concerning imaging characteristics of said image pickup optical system.

21. A position detection device according to claim 19, wherein said position detection device is of an image processing type, and said detector has an image processing device optically connected to said image pickup optical system.

22. A method for making an exposure apparatus which transfers a pattern of a mask onto an object, comprising:

providing a projection system between the mask and the object to project the pattern onto the object;

providing an image pickup system which has a predetermined positional relationship with the projection system and picks up an image of a mark formed on at least one of the mask or the object; and providing a detector which is connected to the image pickup system and detects a position of said mark based on a mark image picked up by the image pickup system and an imaging characteristic of the image pickup system.

23. A method according to claim 22, wherein the image pickup system picks up an image of the mark of the mask without using the projection system.

24. A method according to claim 22, wherein the image pickup system picks up an image of the mark of the object through the projection system.

25. A method according to claim 22, wherein said detector has a memory which stores data concerning imaging characteristics of said image pickup system.

26. A method according to claim 22, wherein the image pickup system picks up the image of a mark on the mask and the image of a mark on the object simultaneously.

27. A method according to claim 22, wherein the object is of a rectangular shape.

28. A method according to claim 22, wherein the projection system projects said pattern optically.

29. A method according to claim 22, wherein the image pickup system picks up said mark optically.

30. A method according to claim 22, wherein the exposure apparatus is a scanning type exposure apparatus.

* * * * *